United States Patent
Nayak et al.

(10) Patent No.: US 7,622,939 B2
(45) Date of Patent: Nov. 24, 2009

(54) METHODS AND APPARATUSES FOR IMPROVED STABILIZATION IN A PROBING SYSTEM

(76) Inventors: Uday Nayak, 3319 Pinkerton Ct., San Jose, CA (US) 95148; Richard James Casler, Jr., 11256 Palos Verdes Ct., Cupertino, CA (US) 95014; Max Jedda, 679 Piggin Ave., Sunnyvale, CA (US) 94087

( * ) Notice: Subject to any disclaimer, the term of this patent is extended or adjusted under 35 U.S.C. 154(b) by 0 days.

(21) Appl. No.: 11/874,837

(22) Filed: Oct. 18, 2007

(65) Prior Publication Data

US 2008/0100321 A1 May 1, 2008

Related U.S. Application Data (63) Continuation of application No. 11/335,081, filed on Jan. 18, 2006, now Pat. No. 7,352,198.

(51) Int. Cl.
*G01R 31/02* (2006.01)
(52) U.S. Cl. .................................................. 324/758
(58) Field of Classification Search .................. None
See application file for complete search history.

(56) References Cited

U.S. PATENT DOCUMENTS

| | | | |
|---|---|---|---|
| 5,410,259 A | | 4/1995 | Fujihara et al. |
| 5,422,579 A | | 6/1995 | Yamaguchi |
| 5,449,985 A | | 9/1995 | Kanemitsu et al. |
| 5,473,698 A | * | 12/1995 | Garnjost et al. ............ 381/71.2 |
| 5,550,483 A | | 8/1996 | Boyette et al. |
| 5,644,245 A | | 7/1997 | Saitoh et al. |
| 5,793,598 A | * | 8/1998 | Watanabe et al. ........... 361/144 |
| 5,814,733 A | | 9/1998 | Khoury et al. |
| 6,040,700 A | | 3/2000 | Berar |
| 6,096,567 A | | 8/2000 | Kaplan et al. |
| 6,111,421 A | | 8/2000 | Takahashi et al. |
| 6,213,442 B1 | * | 4/2001 | Ivers et al. ................. 248/550 |

(Continued)

FOREIGN PATENT DOCUMENTS

DE   10 2004 057776 A1   7/2005

(Continued)

OTHER PUBLICATIONS

PCT Notification Concerning Transmittal of International Preliminary Report on Patentability (Chapter 1 of the Patent Cooperation Treaty), International Application No. PCT/US2006/042343 mailed Jul. 31, 2008, total 7 pages.

(Continued)

*Primary Examiner*—Ha Tran T Nguyen
*Assistant Examiner*—Roberto Velez
(74) *Attorney, Agent, or Firm*—Blakely, Sokoloff, Taylor & Zafman LLP (57) ABSTRACT

Improved methods and apparatuses for automatically and accurately maintaining the alignment of a wafer prober to the bonding pads of a semiconductor device in the presence of motion disturbances are provided. In one embodiment of one aspect of the invention, a feedback control system incorporating information from a number of acceleration and/or velocity sensors is used to maintain the desired contact position in the presence of motion disturbances. Other aspects and other embodiments are also described.

25 Claims, 6 Drawing Sheets

U.S. PATENT DOCUMENTS

| | | |
|---|---|---|
| 6,832,143 B2 * | 12/2004 | Trudeau et al. ............... 701/37 |
| 2002/0080041 A1 | 6/2002 | Ohno et al. |
| 2004/0100297 A1 | 5/2004 | Tanioka et al. |
| 2005/0083073 A1 | 4/2005 | Makoto et al. |
| 2005/0253613 A1 | 11/2005 | Komatsu et al. |

FOREIGN PATENT DOCUMENTS

| | | | |
|---|---|---|---|
| EP | 1 069 437 A1 | 1/2001 | |
| WO | WO 2005031186 A2 * | 4/2005 | |

OTHER PUBLICATIONS

PCT Notification of Transmittal of the International Search Report and The Written Opinion of this International Searching Authority, or the Declaration; PCT International Search Report; and PCT Written Opinion of the International Searching Authority, International Application No. PCT/US2006/042343 mailed Apr. 4, 2007, total 12 pages.

* cited by examiner

METHODS AND APPARATUSES FOR IMPROVED STABILIZATION IN A PROBING SYSTEM

RELATED APPLICATIONS

This application is a continuation of U.S. patent application Ser. No. 11/335,081, now U.S. Pat. No. 7,352,198, filed Jan. 18, 2006.

FIELD OF THE INVENTION

This invention relates to systems for probing systems, such as a wafer prober, having a plurality of contact points, such as probe tips, designed to make electrical contact with targets such as semiconductor devices.

BACKGROUND OF THE INVENTION

Integrated circuits are often manufactured on a semiconductor substrate, such as a silicon wafer. The silicon wafer is typically a thin circular plate of silicon that is 150 or 200 or 300 millimeters in diameter and approximately 2 millimeters thick. Typically, a single wafer will have numerous devices which are integrated circuits formed in a lattice pattern. Each device consists of numerous layers of circuitry and a collection of external bonding (and optional testing) pads. The bonding pads are small sites, typically 3 mils square, made usually with aluminum that eventually serve as the device's connections to the pin leads.

Probing involves contacting the bonding pads with probe tips to make an electrical (resistive) connection between the probe tips and the bonding pads or other pads. Accurate positioning of the pads under the tips is necessary both to avoid causing damage to the pads and to maintain the desired contact pressure that ensures good electrical contact (the pins must in fact "scrub" through an outer oxide layer forming over the pads under normal atmospheric conditions).

External disturbances, such floor vibrations (typically at 10-30 Hz), accidental hits to the prober unit, or other sources of induced vibrations can disrupt accurate probe tip to pad positioning. Given the inherent flexural, or non-rigid properties of the joints and connections between components in the prober system, vibrations may arise in different parts of the unit at different frequencies and amplitudes. Flexural deflections at the connections will cause non-compensatory relative displacements between the wafer surface and the probe tips which usually resemble pins.

Relative displacements can be reduced by increasing the rigidity of the connections, or by providing isolation between the floor and the unit. These methods have the disadvantage that they increase the weight of the system thereby increasing both the cost (by, for example, requiring to change the isolation properties at every installation) and the sensitivity in the frequency domain to such disturbances. Prior art systems include so-called isolation tables, typically very heavy and rigidly bolted to a deep underground foundation. These tables result in reaction cancellation or reactive isolation (for example, as is done for wafer steppers). Active isolation tables also exist that include vibration compensation with dedicated actuators. However, all these prior art systems cost very high sums ($800,000 to a million dollars) and incur complex installation procedures precluding portability of the probing unit (portability can be a great advantage for non-in-house production, for example in foundries). On the other hand, existing portable probing systems, due to their lighter weight, do not incorporate isolation tables and are inherently less rigid. Currently, there are no prior art portable probing systems that incorporate active vibration suppression or compensation. Portable probing units incorporating active disturbance compensation would be highly desirable because the corrections would improve throughput by allowing the system to step from die to die on the wafer much quicker.

SUMMARY OF THE DESCRIPTION

Improved methods and apparatuses are provided for accurately maintaining the contact positioning between a plurality of pads on a wafer device and a plurality of contact electrodes (e.g. pins on a probe card) in the presence of motion disturbances. According to one embodiment of an aspect of the invention, acceleration and/or velocity sensors are integrated into a motion feedback control system in order to compensate for unwanted motion disturbances (such as floor vibrations).

According to another embodiment of another aspect of the invention, a compensation scheme based on the different accelerations or velocities between components of the prober system is used.

According to yet another embodiment of another aspect of the invention, a compensation scheme based on the relative acceleration between components of the prober system is used.

A further embodiment of the invention includes using existing actuators in the wafer alignment mechanism to apply the compensation forces determined by the control scheme.

The solutions provided by at least certain embodiments of the invention thus result in the first portable wafer prober that actively suppresses or compensates for the motion disturbances via a control and sensing system. These and other embodiments, features, aspects, and advantages of the present invention will be apparent from the accompanying drawings and from the detailed description and appended claims which follow.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Methods and apparatuses for accurately maintaining a desired contact position between a probe tip and a bonding pad in a testing system in the presence of disturbances are disclosed. In the following description, for purposes of explanation, numerous specific details are set forth in order to provide a thorough understanding of the present invention. It will be evident, however, to one skilled in the art that the present invention may be practiced without these specific details. In other instances, well-known structures and devices are shown in block diagram form in order to avoid unnecessarily obscuring the present invention.

Figure 1:
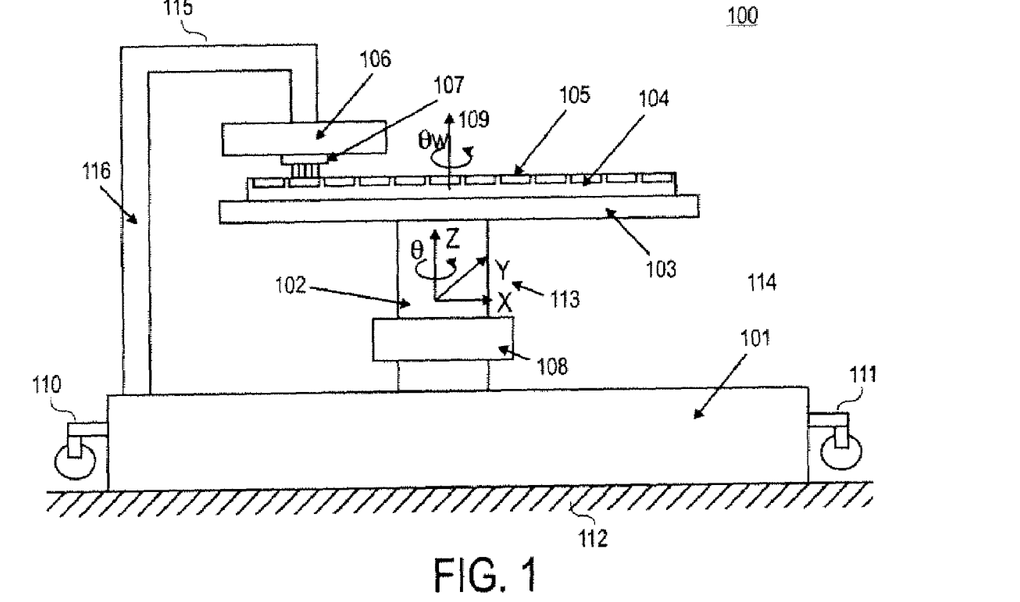
FIG. 1 illustrates a side view of a possible embodiment of a prober testing system and its two main stages.

Probing involves contacting the pad surface of the wafer with probe tips such that the tips "scrub" or slide across the bond pads under high pressure conditions. In one possible embodiment of the present invention, the prober system consists of two main components, or stages, one holding the wafer and the other the probe card. The two stages move relative to one another and are brought together in order to create the high pressure contact between the pads and tips. FIG. 1 shows a schematic of one such possible embodiment of a probing system 100, consisting of two main stages 114 and 115. The two main stages of the system shown are termed the Wafer Holder Assembly (WHA) 114 and the Probe-card Holder Assembly (PHA) 115. In this illustrative example, the WHA stage 114 is capable of motion along the X,Y,Z and theta$_g$ directions 113 while the PHA stage 115 is held stationary. In addition, the wafer 104 itself may be rotated around the theta$_w$ direction relative to its holding chuck 103 in the WHA stage. In this manner the wafer 104 being supported by the WHA stage can be moved relative to the probe card pins 107 being supported by the PHA stage so that the pins can be brought in contact with any given pads 105 on the wafer 104.

The WHA stage is in turn composed of several components: a granite base 101, which sits on the floor 112, and which includes a X and Y gantry system which allows a Z stage 102 to move with low friction along the X and Y directions 113 on rails (not shown in this figure); and a chuck 103, whose purpose is to hold a wafer 104 to present a number of die pads 105 for testing. The chuck 103 is connected to the Z stage 102 of the gantry system and thus movable along the X,Y,Z and theta directions 113 by an actuation system 108 which is coupled to the gantry system. The gantry also houses a motion control system which makes use of sensor information as described below.

The PHA stage consists of a probe card chuck 106 whose purpose is to present the probe card pins 107 for contact with the wafer pads 105. The probe card chuck is supported by a structure 116 directly connected to the granite base 101. In this illustrative example, the PHA stage has no motion mechanism and is stationary.

The probing system 100 may be moved on wheels, such as wheels 110 and 111; the wheels may be a set (e.g. four) wheels which can be retracted so that the granite base rests on the floor (e.g. either directly on the floor or on retractable legs) and the set of wheels can also be extended so that the probing system 100 can be rolled around on the set of wheels. The wheels 110 and 111 are shown in a retracted position in FIG. 1. The set of wheels allows the probing system 100 to be portable.

Figure 2:
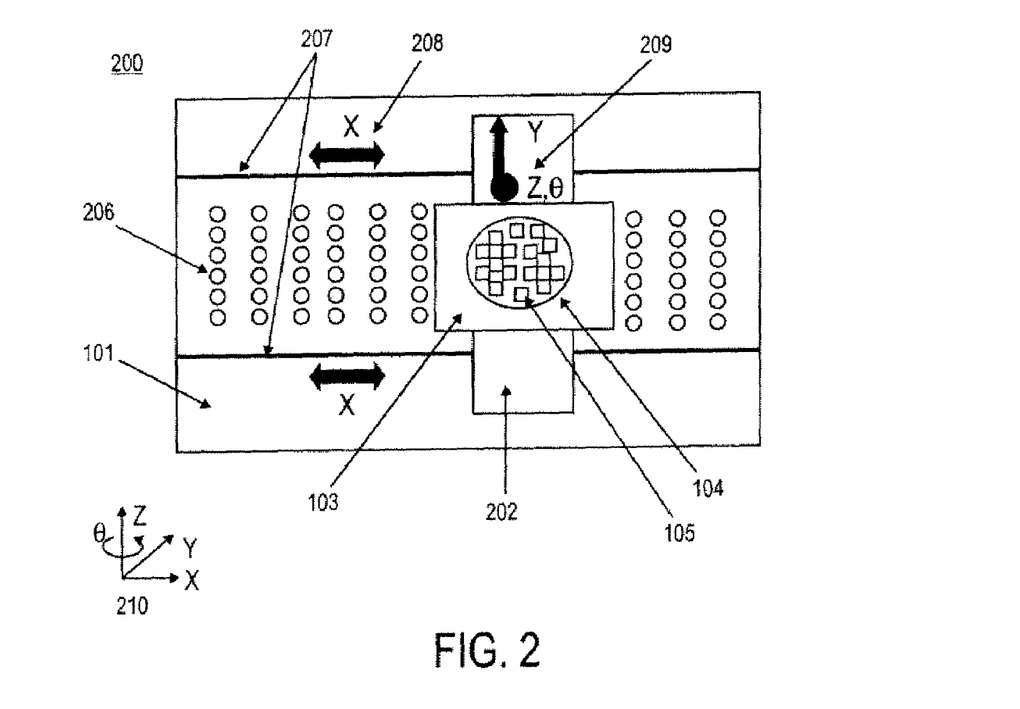
FIG. 2 illustrates a top view of the prober system of FIG. 1.

FIG. 2 is a top view of the system shown in FIG. 1. In this illustrative example the granite base 101 is shown to have a series of evenly distributed air orifices 206 which blow air upwards towards the Z stage 102 in order to help it move smoothly over the granite base 101 and thus alleviate some of the contact friction between the Z stage 102 and the granite base 101. In this manner, the Z stage 102 can be said to "float" on the granite base 101. Two rails 207 on the granite base 101 channel the motion of the Z stage 102 along the X direction 208. The bridge 202 rests on top of the granite base 101 and supports the Z stage 102 and the chuck 203 which in turn holds the wafer 104 and its contact pads 105. The chuck 103 is moved along the X direction 208 (on the rails 207) with respect to the granite base 101 by two motors (not shown) and as well along the Y, Z and theta ($\theta$) directions 209 with respect to the gantry 202 by an additional motion mechanism (not shown) housed in the gantry system, which includes the bridge 202 and the rails 207. This allows the contact pads 205 on the wafer card 204 to be effectively moved linearly along the three possible directions X, Y and Z 210 and rotationally along the yaw axis (around the Z axis or theta direction 210). The Z stage 102 moves along the Y axis by moving up and down along the bridge 202. The bridge 202 is coupled to the rails 207 and moves in X along the rails 207.

In a typical probing system the connections joining the different components are likely to exhibit flexibilities. Because the connections between components are not perfectly rigid (as an extreme example, the gantry is floating on the granite base, lifted by the air table shown in FIG. 2) there will be vibrationary or flexural relative displacements between the components of the system when a part of the system is exposed to a disturbance. The flexural deflections may in turn cause non-compensatory dislocations between the wafer pad and the probe card pins, thus degrading performance.

Figure 3:
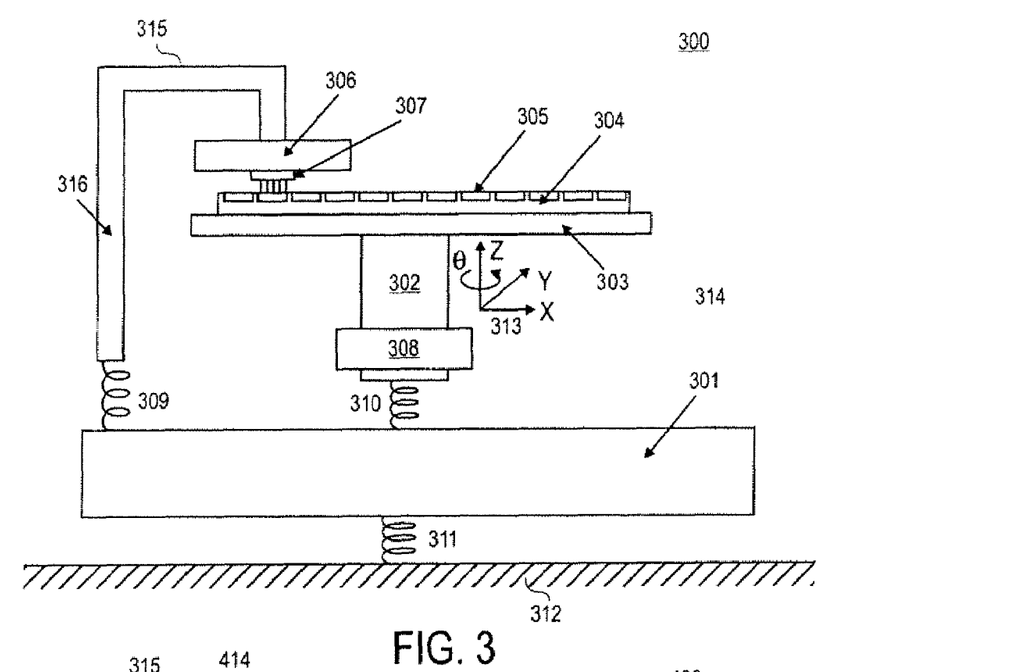
FIG. 3 shows the prober system of FIG. 1 with added flexibilities between various components.

FIG. 3 depicts a possible embodiment of a probing system presenting flexural connections between some of the various components. A number of exemplary non-rigid connections between some of the components are shown in FIG. 3. Thus, the joint 310 between the Z stage 302 and the granite base 301 is illustrated with a spring symbol 310 to indicate the flexural (and vibratory) nature of the joint. Similarly, the connection 309 between the PHA stage 315 and the granite base 301 of the WHA stage 314 as well as the joint 311 between the granite base 301 and the floor 312 are also illustrated with spring symbols. It will be understood that actual physical springs are not present but that the joints may be modeled or represented by these springs.

Unwanted relative displacements can be reduced by increasing the flexural rigidity of the connections, or by providing isolation between the floor and the system. These methods have the disadvantage of requiring an increase in the weight of the system (thereby raising the sensitivity in the frequency domain to motion disturbances), and of requiring a change in the isolation properties at installation of a probing system. A less costly and complex solution that would reduce the effect of unwanted vibrations is to actively suppress or compensate for the motion disturbances via a sensing and control system.

In a possible embodiment of another aspect of the invention, disturbance measurement devices can be added to several locations on the probing system. For example, one sensor could be placed on the granite base, another on the XYZ motion mechanism on the gantry system and a third on the probe pin locating interface. Disturbance amplitude and phase information is measured continuously at all three locations and along different directions (X, Y and Z). The sensing information could be input into the motion controller through low pass filters to eliminate high-frequency noise in the signals. The controller would then process the relative amplitude and phase information to apply compensatory corrections to the system in the X,Y,Z or theta directions through the motion mechanism's existing actuation drives. The resultant motion is devoid of all uncontrolled relative displacements between the wafer substrate and the probe pins. In addition, the corrections would allow the system to step from die to die on the wafer much faster because the accelerometers would also be used to cancel out the reaction forces (internal disturbances) as the wafer chuck moves from probing one die to a position to probe the next die.

Figure 4:
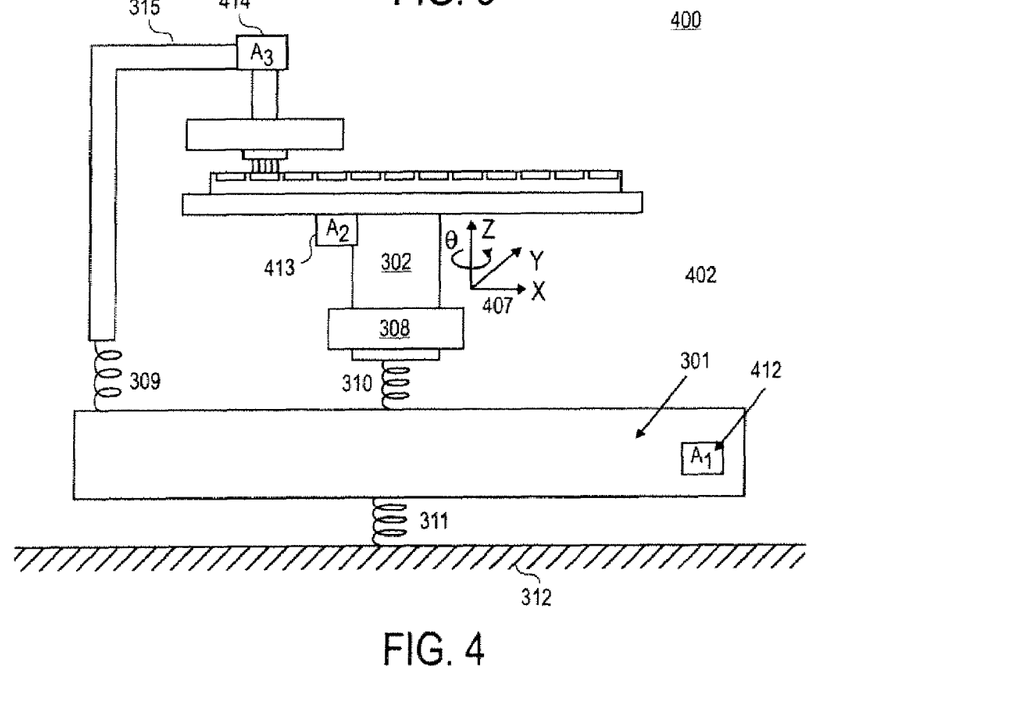
FIG. 4 illustrates an embodiment of acceleration sensing in a prober testing system with flexible connections.

FIG. 4 shows the same side view of the exemplary probing system presented in FIG. 3 with the addition of accelerometers at three different locations on the system. The boxes $A_1$ 412, $A_2$ 413 and $A_3$ 414 represent three accelerometers added to measure the motion of the granite base 301, the bridge/chuck/wafer assembly 402 (which can be assumed to be rigidly connected and thus considered as a single vibratory element) and the PHA stage 315, respectively.

The addition of these three sensors allows quantification of the magnitude and phase of the vibratory accelerations and/or velocities induced at each of these three locations by an external or internal disturbance. Similarly, the measurements can be used to derive the relative acceleration, velocity, magnitude and phase between the measured components. Both types of measurement, individual and relative, can be used in different control schemes to compensate for unwanted displacements.

It would be possible in another embodiment of the same aspect of the invention to alternatively use velocity sensors or a combination of velocity and acceleration sensors or different numbers of sensors and at different locations. It will also be appreciated that such sensors may be used to compensate for motion disturbances in wafer probing systems which use sawyer motors (rather than a gantry system) to move one or both of the wafer chuck and the probe card platform relative to each other.

Figure 5:
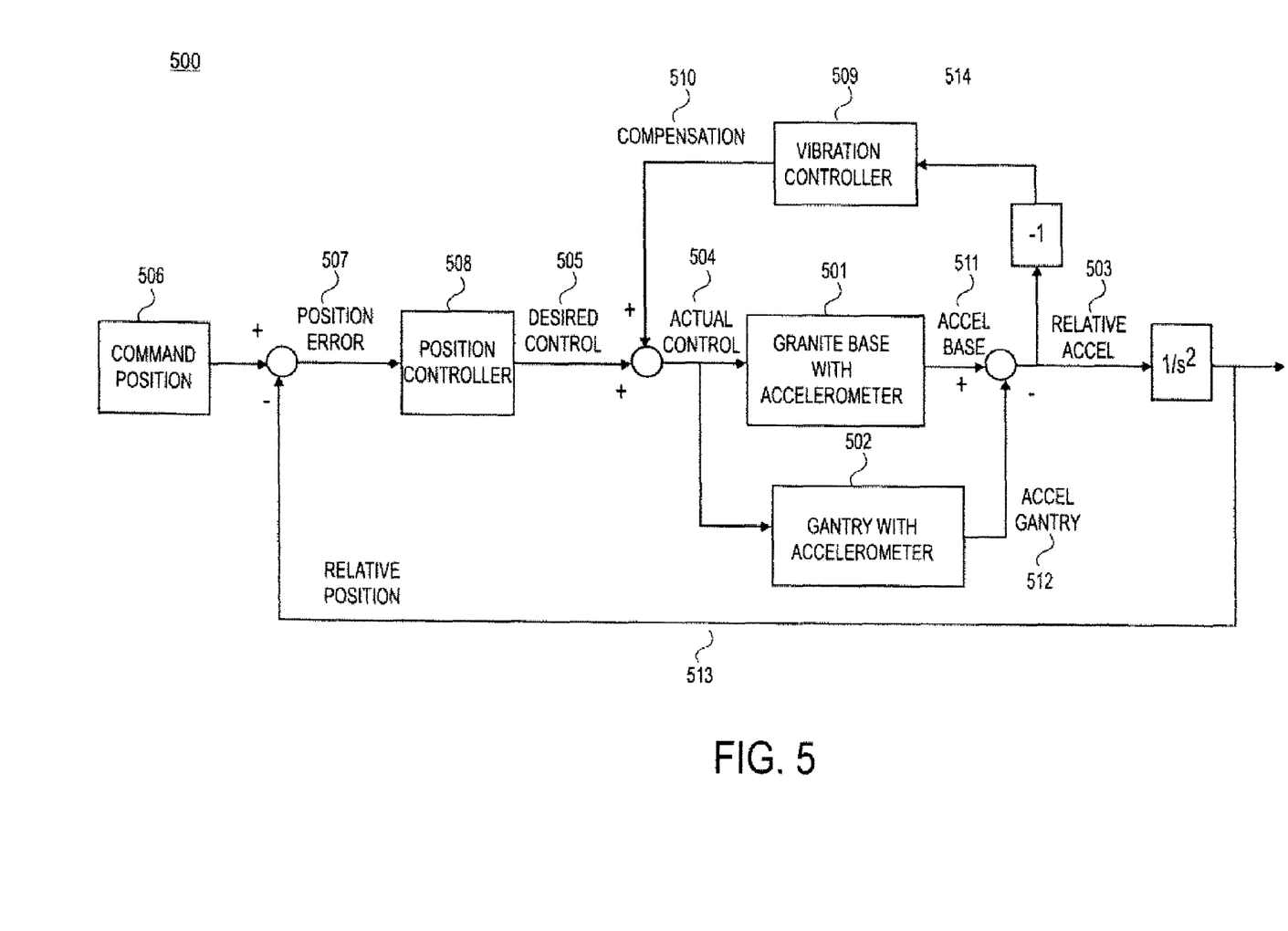
FIG. 5 illustrates a block diagram of a feedback control scheme incorporating relative acceleration compensation.

FIG. 5 shows a block diagram of a possible embodiment of a control system incorporating acceleration information from two sensors 501 and 502 located at the granite base and the gantry, respectively. This particular embodiment serves to illustrate another aspect of the invention, namely a control scheme designed to eliminate contact position disturbances during operation. In the particular illustrative embodiment shown in FIG. 5, the controller consists of two main loops: a position control loop 513 with its own position controller 508 and an acceleration control loop 514 with its own vibration controller 509.

As explained above, the Z stage is attached to the bridge of the gantry system and is floating on the granite base. The gantry is here assumed to comprise the bridge/cluck/wafer assembly 402 of FIG. 4. When the actuation motors drive the gantry forward, the same amount of traction force will act on the granite base with reverse direction (by Newton's third law of motion). This can be considered an internal disturbance. Similarly, any external disturbance acting on the base (for example from floor shaking) will also appear in the gantry because of the traction force between the gantry and the granite base. Because of the non-rigid connection between the gantry and base, vibratory relative displacements will be induced by such disturbances.

The design objective of the compensation scheme shown in FIG. 5 is to ensure that both the gantry and the granite base have the same amplitude and phase, that is, the control system is compensating for (or eliminating) the relative, vibrations between the gantry and base.

For the purposes of this particular illustrative embodiment of this aspect of the invention, it will be assumed that the there is a rigid connection between the granite base and floor, and both will be viewed as a single spring-mass system with a mass $M_{EQ}$ and a stiffness $K_{EQ}$. The stiffness $K_{EQ}$ would correspond to the spring 310 shown in FIG. 4 between the base and gantry.

The floor/base structure can move relative to the mass of the gantry, which for this illustrative example will be assumed to be a linear system with mass $M_{Gantry}$ and no stiffness of its own. Based on the above assumptions, the dynamics of the gantry relative to the granite base, termed $G_{Gantry\text{-}on\text{-}Granite}$ (which will produce the relative motion between the base and gantry that the controller in FIG. 5 is designed to suppress), can be written in the frequency domain as the following transfer function:

$$G_{Gantry\text{-}on\text{-}Granite}(s) = \frac{Acc_{relative}(s)}{F_{actual}(s)} \quad (1)$$
$$= G_{Gantry}(s) + G_{Granite}(s)$$
$$= \frac{1}{M_{Gantry}} \left( \frac{\frac{s^2}{\omega_2^2} + 1}{\frac{s^2}{\omega_1^2} + 1} \right)$$

where:

$Acc_{Relative}(s)$ is the relative acceleration 503 between the base and gantry obtained by subtracting the accelerometer readings of the base 511 and gantry 512.

$F_{Actual}(s)$ is the control force 504 applied to the base and gantry resulting from the combined action of the Compensation force 510 and the Desired Control force 505.

$G_{Gantry}(s)$ is the transfer function of the dynamics of the gantry.

$G_{Granite}(s)$ is the transfer function of the dynamics of the floor/base.

$\omega_1 = \sqrt{K_{EQ}/M_{EQ}}$ is the resonant frequency of the floor/base structure.

and $\omega_2 = \sqrt{K_{EQ}/(M_{EQ}+M_{Gantry})}$ is the resonant frequency of the gantry and floor/base masses combined.

Given the resonance (or poles, obtained by calculating the roots of the denominator) of Eq. (1), which will be a combination of $\omega_1$ and $\omega_2$, it would be difficult for a servo controller (which in FIG. 5 is a combination of a Position Controller 508 and a Vibration Controller 509) to obtain perfect tracking (i.e. zero position error 507) of a commanded position 506. Therefore, it would be desirable to design a compensation 510 that will also linearize the dynamics between the Desired Control 505 and Relative Acceleration 503 signals in FIG. 5. In that case, the servo controller would have an ideal (zero) error control. In another aspect of the invention, an embodiment of the control scheme would involve such linearization.

Figure 6:
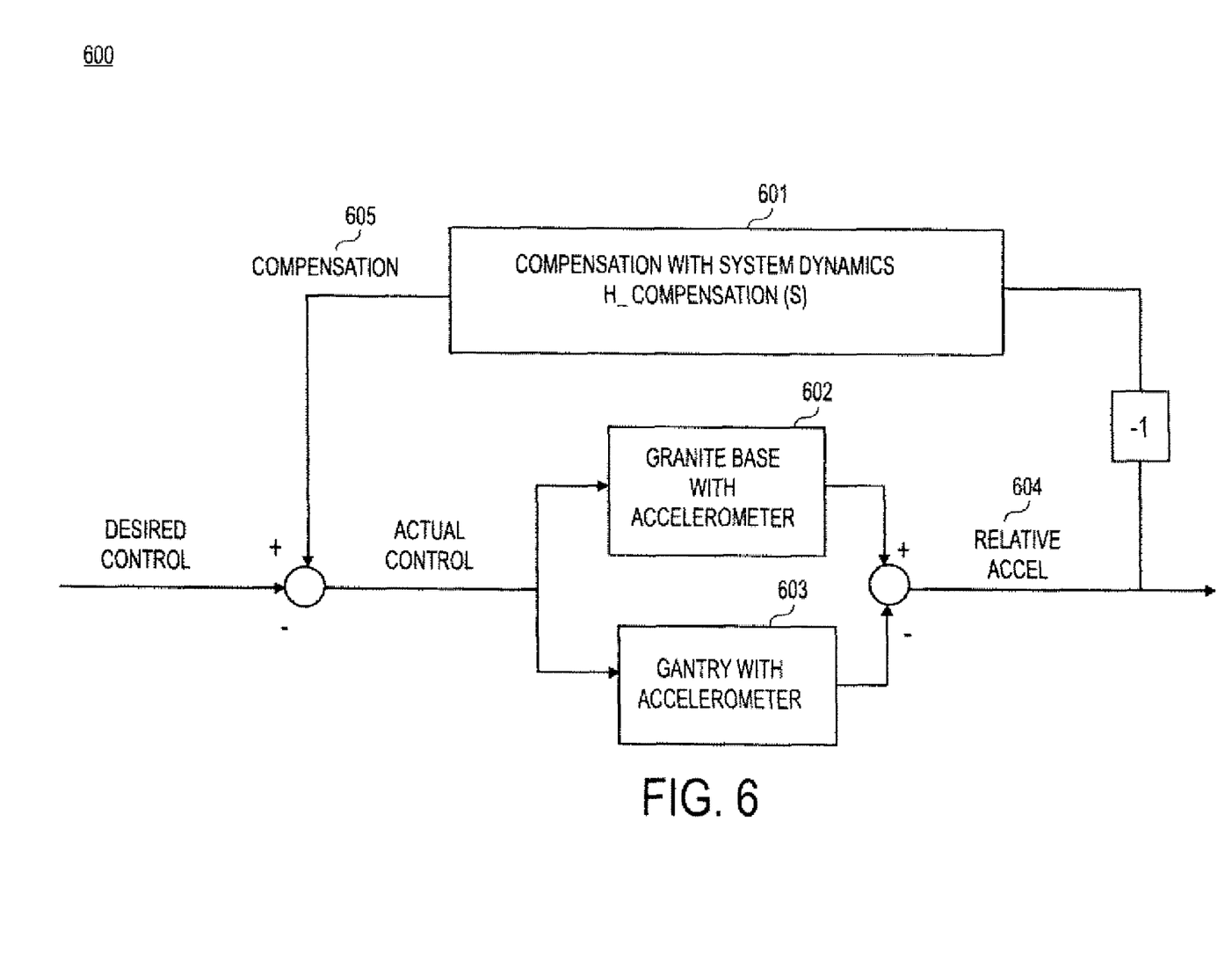
FIG. 6 shows block diagram details of an acceleration compensation scheme based on relative acceleration measurements.

FIG. 6 shows the block diagram of a possible embodiment of a compensation control 601, termed $H_{Compensation}$ (and equivalent to the Vibration Controller 509 in FIG. 5), designed to linearize the relative dynamics 604 between the base 602 and gantry 603 and thus eliminate the resonance. The resulting Compensation 605, or $F_{Compensation}$, can be designed as follows:

$$F_{Compensation} = M_{Gantry} \times Acc_{Granite} \quad (2)$$

where $Acc_{Granite}$ is the acceleration of the granite base.

Equation (2) is insensitive to the resonance frequency, as desired. Incorporating the relative dynamics of the gantry and base, $G_{Gantry\text{-}on\text{-}Granite}$, into Equation (2) the compensation control, $H_{Compensation}$ 601 can then derived as follows:

$$H_{Compensation}(s) = \frac{F_{Compensation}(s)}{Acc_{Relative}(s)} \quad (3)$$

$$= M_{Gantry} \cdot \frac{G_{Granite}(s)}{G_{Gantry-on-Granite}(s)}$$

The equivalent system dynamics with the above compensation, termed $\hat{G}_{Gantry-on-Granite}$, is then:

$$\hat{G}_{Gantry-on-Granite}(s) = \frac{G_{Gantry-on-Granite}(s)}{1 + G_{Gantry-on-Granite}(s)H_{Compensation}(s)} \quad (4)$$

Hence, the resultant system dynamics with compensation (substituting Equations (2) and (3) into Equation (4)) will be:

$$\hat{G}_{Gantry-on-Granite}(s) = \frac{1}{M_{Gantry}} \quad (5)$$

Comparing the relative dynamics with compensation $\hat{G}_{Gantry-on-Granite}$ in Equation (5) and the dynamics without compensation $G_{Gantry-on-Granite}$ in Equation (1), it is clear that the resonance caused by traction forces and external disturbances will be eliminated with the above compensation $H_{Compensation}$. In practice, $H_{Compensation}$ is expected to lead to an ideal linear system and thus to improved position tracking even when disturbances are present and continuous and during operation while the probe pins are contacting the bonding pads.

Figure 7:
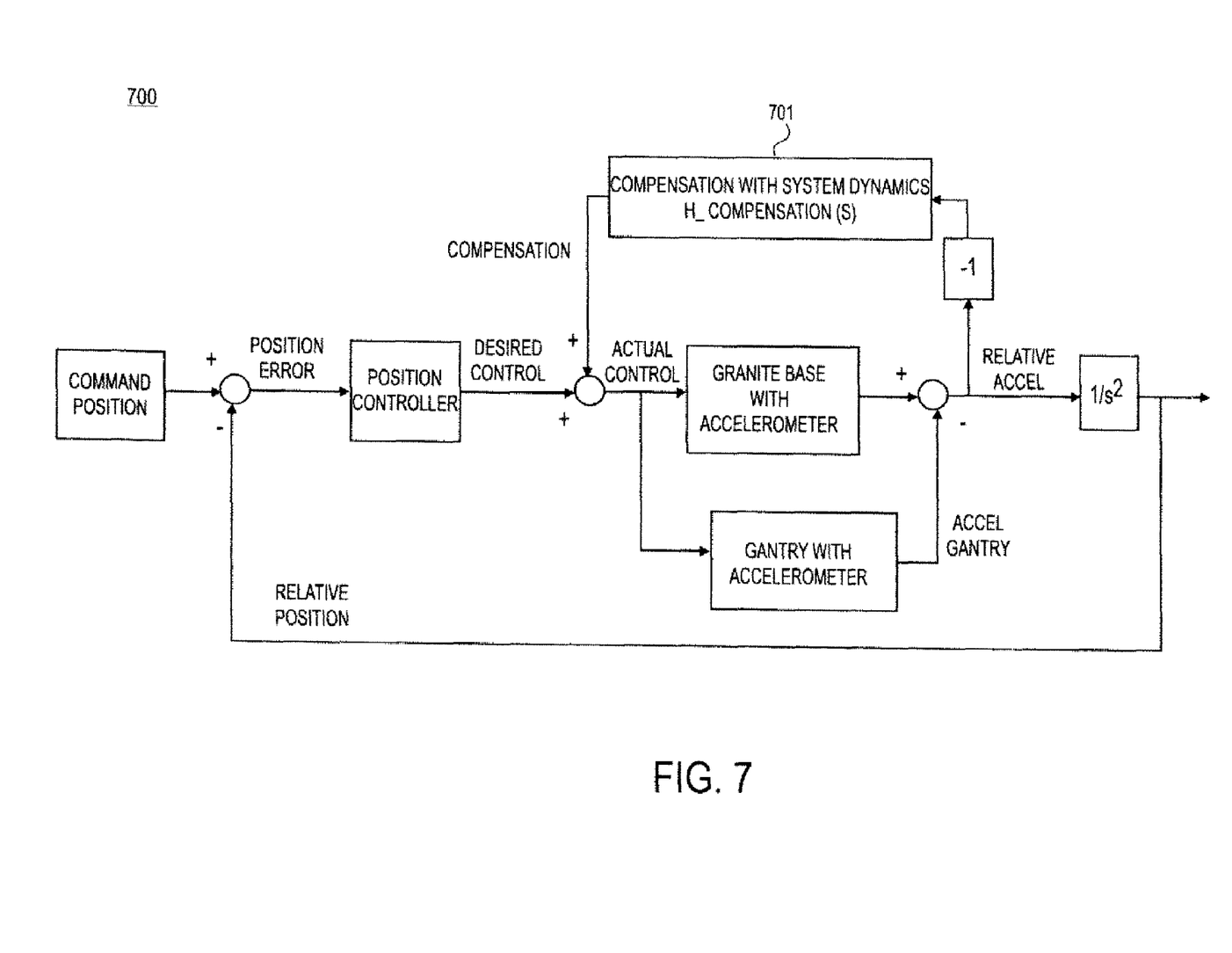
FIG. 7 shows the block diagram of the equivalent acceleration loop in FIG. 6 by adding acceleration based compensation.

FIG. 7 shows the complete control block diagram when the acceleration based compensation control 601 of FIG. 6 is incorporated 701 into the entire control scheme of FIG. 5.

Other embodiments of control systems incorporating the readings of multiple sensors of same or other kinds in order to achieve the accurate and continuous positioning of wafer pads relative to probe pins in any direction and in the presence of motion disturbances are also covered by the present invention. Similarly, other control schemes compensating for individual (non-relative) or relative accelerations of different components in the system in different ways that result in active suppression of motion disturbances in a probing system are also covered by the present invention.

Figure 8:
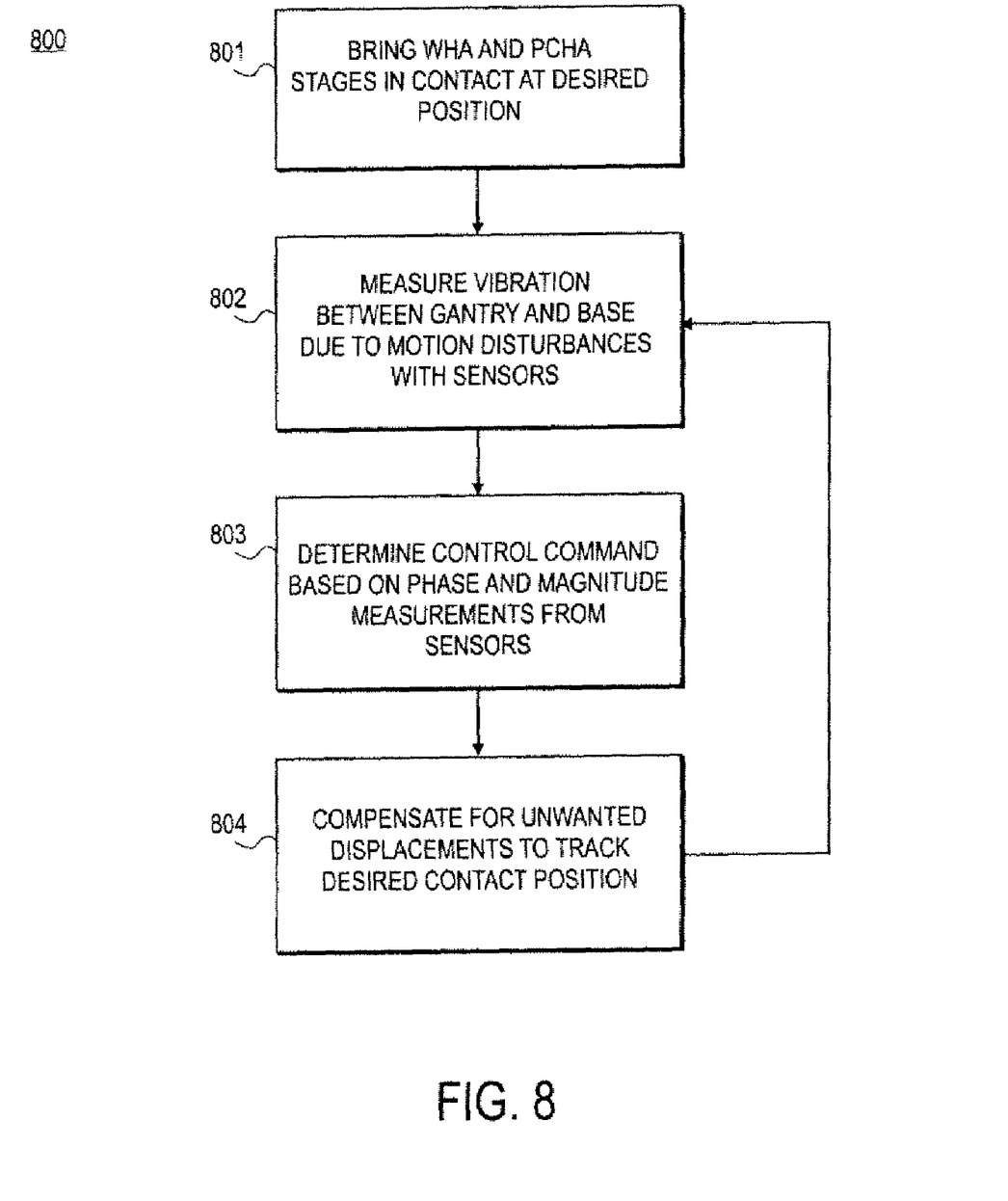
FIG. 8 illustrates a flow diagram showing exemplary operations of a testing system that accurately maintains a desired probe-to-pad contact position by incorporating motion disturbance sensing and compensation.

FIG. 8 is a flow diagram showing a possible embodiment of the steps involved in a testing system making use of sensors and a control system to compensate for motion disturbances on the WHA stage. As a first operation 801, the WHA and PHA stages are brought in contact until the desired contact position and force is achieved. In order to maintain that desired contact position, any vibration (magnitude and phase) between the gantry and base are continuously measured 802 to detect changes in the desired contact position due to motion disturbances such as floor shaking or actuation of the gantry. A control system then determines the required corrective action based on the sensor information 803. The corrective forces are then applied to the gantry via actuators incorporated in the WHA stage to eliminate any unwanted position disturbances and to track the desired position 804. Operations 802-804 are continually repeated (for example every 50 milliseconds), in at least certain embodiments, to ensure that any disturbances to the desired position are promptly corrected. These operations (802-804) are also performed repeatedly (e.g. every 50 milliseconds) as the WHA and the PHA stages are moved relative to one another in order to step from die to die to position the probe tips over a new set of bonding pads in the probing process. Other embodiments where other parameters and components of the system are monitored and controlled are also possible.

The methods described herein can be performed by a data processing system, such as a general or special purpose computer, operating under software control where the software can be stored in a variety of computer readable media.

The various embodiments of the inventions may be used on wafer probers having wafer chucks which hold full wafers or other types of probing systems such as systems which probe die or dice on film frames (which are flexible) or strips (which may be rigid).

Thus, apparatuses and methods have been provided for achieving and maintaining the accurate pad to probe contact positioning in a testing system in the presence of disturbances. Although the present invention has been described with reference to specific exemplary embodiments, it will be evident that various modifications and changes may be made to these embodiments without departing from the broader spirit and scope of the invention as set forth in the claims. Accordingly the specification and drawings are to be regarded in an illustrative rather than a restrictive manner.

We claim:

1. A system operable to maintain a relative position between a first component and a second component, the system comprising: a position controller coupled to an X-Y motion system which is coupled to the first component; at least one sensor coupled to the first component or a frame supporting the first component, wherein the at least one sensor is configured to measure at least one parameter along at least one axis of a three-dimensional coordinate system; and a control system coupled to the first component and configured to receive information from the at least one sensor and configured to determine actuation forces based on the information and wherein the actuation forces act on the first component to repeatedly compensate for vibration disturbances to the system and wherein the control system determines the actuation forces based on at least one of an acceleration and a velocity, wherein the actuation forces are calculated based on a motion of the first component and a motion of the second component, and wherein the X-Y motion system is initially coupled to a base and then configured to move horizontally with respect to the base on a low friction guide by the position controller which controls the X-Y motion system that is coupled to move the first component for positioning using the low friction guide, and wherein the actuation forces are delivered using the X-Y motion system.

2. The system of claim 1:
wherein the at least one parameter is one of a velocity and an acceleration, and wherein the actuation forces are applied as the first component and the second component are moved relative to each other.

3. The system of claim 2 wherein the at least one sensor measures amplitude and phase and wherein the vibration disturbances are orthogonal to a Z axis.

4. The system of claim 1 wherein the actuation forces reduce significantly relative motion between parts of the system and wherein the position controller controls a positioning of the first component relative to the second component such that the position controller is configured to move the first component relative to the second component over a series of movements using the X-Y motion system.

5. The system of claim 1 wherein the actuation forces reduce significantly absolute motion in the system.

6. A method for maintaining a relative position between a first component and a second component, the method comprising: positioning a first component by moving the first component with an X-Y motion system which is coupled to a position controller; measuring at least one parameter along at least one axis of a three-dimensional coordinate system using at least one sensor coupled to one of the first component or a frame supporting the first component; and determining actuation forces using a control system coupled to the first component wherein the control system is configured to receive information from the at least one sensor and to determine actuation forces based on the information and wherein the actuation forces act on the first component to repeatedly compensate for vibration disturbances to the system and wherein the control system determines the actuation forces based on at least one of an acceleration and a velocity, wherein the actuation forces are calculated based on a motion of the first component and a motion of the second component, and wherein the X-Y motion system is initially coupled to a base and then configured to move horizontally with respect to the base on a low friction guide by the position controller which controls the X-Y motion system that is coupled to move the first component for positioning using the low friction guide, and wherein the actuation forces are delivered using the X-Y motion system.

7. The method of claim 6 wherein the at least one parameter is one of a velocity and an acceleration and wherein the position controller controls a positioning of the first component relative to the second component such that the position controller is configured to move the first component relative to the second component over a series of movements using the X-Y motion system.

8. The method of claim 6 wherein the at least one sensor measures amplitude and phase.

9. The method of claim 6 wherein the actuation forces reduce significantly relative motion between parts of the system and wherein the vibration disturbances are orthogonal to a Z axis.

10. The method of claim 6 wherein the actuation forces reduce significantly absolute motion in the system.

11. A computer readable medium encoded with an executable computer program which when executed by a data processing system cause the system to perform a method for maintaining a relative position between a first component and a second component, the method comprising: positioning a first component by moving the first component with an X-Y motion system which is coupled to a position controller; measuring at least one parameter along at least one axis of a three-dimensional coordinate system using at least one sensor coupled to one of the first component or a frame supporting the first component; and determining actuation forces using a control system coupled to the first component wherein the control system is configured to receive information from the at least one sensor and to determine actuation forces based on the information and wherein the actuation forces act on the first component to repeatedly compensate for vibration disturbances to the system and wherein the control system determines the actuation forces based on at least one of an acceleration and a velocity, wherein the actuation forces are calculated based on a motion of the first component and a motion of the second component, and wherein the first component X-Y motion system is initially coupled to a base and then configured to move horizontally with respect to the base on a low friction guide by the position controller which controls the X-Y motion system that is coupled to move the first component for positioning using the low friction guide, and wherein the actuation forces are delivered using the X-Y motion system.

12. The medium of claim 11 wherein the at least one parameter is one of a velocity and an acceleration and wherein the position controller controls a positioning of the first component relative to the second component such that the position controller is configured to move the first component relative to the second component over a series of movements using the X-Y motion system.

13. The medium of claim 11 wherein the at least one sensor measures amplitude and phase.

14. The medium of claim 11 wherein the actuation forces reduce significantly relative motion between parts of the system and wherein the vibration disturbances are orthogonal to a Z axis.

15. The medium of claim 11 wherein the actuation forces reduce significantly absolute motion in the system.

16. A system operable to maintain a relative position between a first component and a second component, the system comprising: a position controller coupled to an X-Y motion system which is coupled to the first component; at least one sensor coupled to the first component or a frame supporting the first component, wherein the at least one sensor is configured to measure at least one parameter along at least one axis of a three-dimensional coordinate system; and a control system coupled to the first component and configured to receive information from the at least one sensor and configured to determine actuation forces based on the information and wherein the actuation forces act on the first component to repeatedly compensate for vibration disturbances to the system and wherein the control system determines the actuation forces based on at least one of an acceleration and a velocity, wherein the actuation forces are calculated based on a motion of the first component and a motion of the second component, and wherein the X-Y motion system is initially coupled to a base and then configured to move horizontally with respect to the base on an air bearing by the position controller which controls the X-Y motion system that is coupled to move the first component for positioning the air bearing, and wherein the actuation forces are delivered using the X-Y motion system.

17. The system of claim 16:
wherein the at least one parameter is one of a velocity and an acceleration, and wherein the actuation forces are applied as the first component and the second component are moved relative to each other.

18. The system of claim 16 wherein the at least one sensor measures amplitude and phase and wherein the vibration disturbances are orthogonal to a Z axis.

19. The system of claim 16 wherein the actuation forces reduce significantly relative motion between parts of the system and wherein the position controller controls a positioning of the first component relative to the second component such that the position controller is configured to move the first component relative to the second component over a series of movements using the X-Y motion system.

20. The system of claim 16 wherein the actuation forces reduce significantly absolute motion in the system.

21. A method for maintaining a relative position between a first component and a second component, the method comprising: positioning a first component by moving the first component with an X-Y motion system which is coupled to a position controller; measuring at least one parameter along at least one axis of a three-dimensional coordinate system using at least one sensor coupled to one of the first component or a frame supporting the first component; and determining actuation forces using a control system coupled to the first component wherein the control system is configured to receive information from the at least one sensor and to determine actuation forces based on the information and wherein the actuation forces act on the first component to repeatedly compensate for vibration disturbances to the system and wherein the control system determines the actuation forces based on at least one of an acceleration and a velocity, wherein the actuation forces are calculated based on a motion of the first component and a motion of the second component, and wherein the X-Y motion system is initially coupled to a base and then configured to move horizontally with respect to the base on an air bearing by the position controller which controls the X-Y motion system that is coupled to move the first component for positioning using the air bearing, and wherein the actuation forces are delivered using the X-Y motion system.

22. The method of claim 21 wherein the at least one parameter is one of a velocity and an acceleration and wherein the position controller controls a positioning of the first component relative to the second component such that the position controller is configured to move the first component relative to the second component over a series of movements using the X-Y motion system.

23. The method of claim 21 wherein the at least one sensor measures amplitude and phase.

24. The method of claim 21 wherein the actuation forces reduce significantly relative motion between parts of the system and wherein the vibration disturbances are orthogonal to a Z axis.

25. The method of claim 21 wherein the actuation forces reduce significantly absolute motion in the system.

* * * * *